United States Patent
Nakashima et al.

[11] Patent Number: 6,166,476
[45] Date of Patent: *Dec. 26, 2000

[54] 1-PORT TYPE SURFACE ACOUSTIC WAVE DEVICE

[75] Inventors: Koji Nakashima; Hideya Morishita, both of Ishikawa-ken, Japan

[73] Assignee: Murata Manufacturing Co., Ltd, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/933,217

[22] Filed: Sep. 18, 1997

[30] Foreign Application Priority Data

Sep. 19, 1996 [JP] Japan ..................................... 8-248031
Apr. 7, 1997 [JP] Japan ..................................... 9-088132

[51] Int. Cl.$^7$ ..................................................... H01L 41/08

[52] U.S. Cl. ........................................................ 310/313 R

[58] Field of Search ............................ 310/313 R, 313 B, 310/313 D, 348, 351–353, 344; 333/149, 150, 192, 195

[56] References Cited

U.S. PATENT DOCUMENTS

| | | | |
|---|---|---|---|
| 4,450,377 | 5/1984 | Briese | 310/348 |
| 4,683,394 | 7/1987 | Koshino | 310/313 R |
| 4,737,742 | 4/1988 | Takoshima et al. | 310/348 X |
| 5,252,882 | 10/1993 | Yatsuda | 310/348 X |
| 5,281,883 | 1/1994 | Ikata et al. | 310/313 R |
| 5,400,950 | 3/1995 | Myers et al. | 228/180.22 |
| 5,459,368 | 10/1995 | Onishi et al. | 310/313 R |
| 5,699,027 | 12/1997 | Tsuji et al. | 310/313 R X |

FOREIGN PATENT DOCUMENTS

| | | | |
|---|---|---|---|
| 0 682 408 | 11/1995 | European Pat. Off. . | |
| 404294626 | 10/1992 | Japan | 333/195 |
| 405335878 | 12/1993 | Japan . | |

*Primary Examiner*—Mark O. Budd
*Attorney, Agent, or Firm*—Keating & Bennett, LLP

[57] ABSTRACT

A 1-port type surface acoustic wave device can be produced by using the same tools as used for the production of a 2-port type surface acoustic wave device and achieves a substantial improvement in terms of impact resistance. A 1-port surface acoustic wave resonator includes a surface acoustic wave substrate, two dummy bump electrodes and two input/output bump electrodes disposed on the surface acoustic wave substrate adjacent to a plurality of input/output extraction electrodes.

6 Claims, 3 Drawing Sheets

1-PORT TYPE SURFACE ACOUSTIC WAVE DEVICE

BACKGROUND OF THE INVENTION

1. Field of the Invention

The present invention relates to a 1-port type surface acoustic wave device including a 1-port surface acoustic wave resonator and a base substrate which are connected together by solder bump bonding.

2. Description of the Related Art

FIGS. 5 through 7 show the construction of a conventional 1-port type surface acoustic wave device consisting of a base substrate and a 1-port surface acoustic wave resonator placed thereon and connected thereto by solder bump bonding. FIG. 5 is a plan view of the 1-port surface acoustic wave resonator; FIG. 6 is a plan view of the base substrate; and FIG. 7 is a sectional view of the 1-port type surface acoustic wave device.

As shown in FIG. 5, this 1-port surface acoustic wave resonator, indicated by numeral 10, includes a surface acoustic wave substrate 11. In the substantially central portion of one main surface of the surface acoustic wave substrate 11, there is provided an IDT electrode 12. Reflector electrodes 13 are provided on either side of the IDT electrode 12. Further, two input/output extraction electrodes 14 extend out from the IDT electrode 12. A round input/output bump electrode 15 is located at the forward end of each extraction electrode 14.

The base substrate, which is indicated by numeral 20, is formed of a ceramic material, such as alumina. As shown in FIG. 6, on one main surface of the base substrate 20, a rectangular-loop-like bonding land 21 is provided for allowing the base substrate to be soldered to a metal cap 30. Further, two round input/output electrode lands 22 are provided for connecting and securing the 1-port surface acoustic wave resonator 10 to the base substrate electrically and mechanically, and two extraction electrodes 23 are respectively connected to the input/output electrode lands 22 and provide a desired electrical connection. On the other main surface of the base substrate 20, input/output terminal electrodes (not shown) are provided and are connected to the extraction electrodes 23 via through-holes 25 or the like.

As shown in FIG. 7, in the conventional 1-port type surface acoustic wave device, the 1-port surface acoustic wave resonator 10 is joined to the base substrate 20 in a face down arrangement. That is, that surface of the 1-port surface acoustic wave resonator 10 on which the electrodes shown in FIG. 5 are disposed is arranged facing downwards and, in this condition, the input/output bump electrodes 15 of the 1-port surface acoustic wave resonator 10 are connected and secured, electrically and mechanically, to the input/output electrode lands 22 of the base substrate 20 via of solder bumps 51. Then, the metal cap 30, one side of which is open, is joined to the bonding land 21 of the base substrate 20 by solder 52, whereby the 1-port surface acoustic wave resonator 10 is sealed in the package defined by the base substrate 20 and the metal cap 30.

As described above, the 1-port surface acoustic wave resonator has two input/output terminals. In the conventional 1-port type surface acoustic wave device, the 1-port surface acoustic wave resonator 10 is joined to the base substrate 20 by solder bump bonding between the two input/output bump electrodes 15 and the two input/output electrode lands 22 of the base substrate 20, which are located at positions corresponding to the input/output bump electrodes 15 so as to provide solder bump bonding at two positions.

Apart from the above-described 1-port type surface acoustic wave device, which is equipped with a 1-port surface acoustic wave resonator, there exists a 2-port type surface acoustic wave device which has a construction similar to that of the 1-port type surface acoustic wave device and which has a 2-port surface acoustic wave resonator with two IDT electrodes joined to a base substrate by solder bump bonding. The 2-port surface acoustic wave resonator has four terminals: two input/output terminals and two grounding terminals. Generally speaking, bump electrodes and electrode lands corresponding to the four terminals are formed on the 2-port surface acoustic wave resonator and the base substrate. The bump electrodes and the electrode lands which are located at positions which correspond to each other are connected together by solder bump bonding.

Thus, the conventional 1-port type surface acoustic wave device has a problem in that, even when it is formed by using a surface acoustic wave resonator and a base substrate which have the same sizes as those of a 2-port type surface acoustic wave device, it is impossible to use the same tools for its production as those used for the production of the 2-port type surface acoustic wave device. For example, the tool used in providing solder bumps on the base substrate and the tool used in effecting solder bump bonding when forming a 1-port type surface acoustic wave device must be different from those used when forming a 2-port type surface acoustic wave device. That is, when producing the above-described 1-port type surface acoustic wave device, it is impossible to use the tools for producing a 2-port type surface acoustic wave device. Thus, it is difficult for the same tools to be used in the production of different types of surface acoustic wave devices. As a result, the administration of the tools is rather difficult, resulting in a high cost in terms of administration and production.

Further, in the conventional 1-port type surface acoustic wave device, the 1-port surface acoustic wave resonator is only joined to the base substrate by two solder bumps, so that the conventional 1-port type surface acoustic wave device exhibits a rather poor impact resistance when, for example, it is dropped.

SUMMARY OF THE INVENTION

To overcome the disadvantages discussed above, the preferred embodiments of the present invention provide a 1-port type surface acoustic wave device which can be produced by using the same tools as those used for the production of a 2-port type surface acoustic wave device and which provides improved impact resistance.

According to one preferred embodiment of the present invention, a 1-port type surface acoustic wave device includes a 1-port surface acoustic wave resonator including a surface acoustic wave substrate on which two input/output bump electrodes and at least two dummy bump electrodes are provided; and a base substrate on which input/output electrode lands and dummy electrode lands are provided, wherein the 1-port surface acoustic wave resonator is joined to the base substrate by connecting the bump electrodes to the corresponding electrode lands by solder bump bonding.

In the above-described construction, at least four bump electrodes are disposed on the 1-port surface acoustic wave resonator, and at least four electrode lands corresponding to the bump electrodes are disposed on the base substrate on which the 1-port surface acoustic wave resonator is to be placed, wherein the 1-port surface acoustic wave resonator can be produced by using the same tools as used in the production of a 2-port-type surface acoustic wave device of a similar construction. As a result, it is possible to produce different kinds of surface acoustic wave devices by using the same tools, thereby achieving a reduction in the number of tools.

Further, the 1-port surface acoustic wave resonator is connected and secured to the base substrate by at least four solder bumps, whereby a substantial improvement is achieved in terms of impact resistance as compared with the conventional device.

DETAILED DESCRIPTION OF PREFERRED EMBODIMENTS

Preferred embodiments of the present invention will now be described with reference to the drawings.

Figure 1:
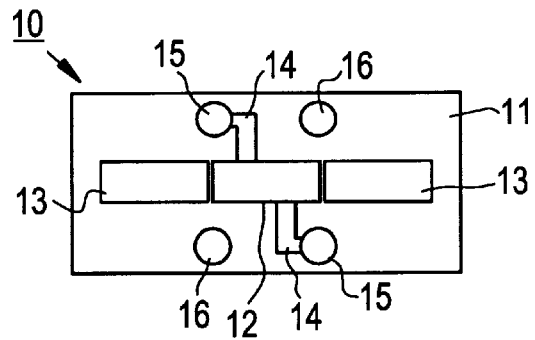
FIG. 1 is a plan view of a 1-port surface acoustic wave resonator in accordance with a preferred embodiment of the present invention.
Figure 2:
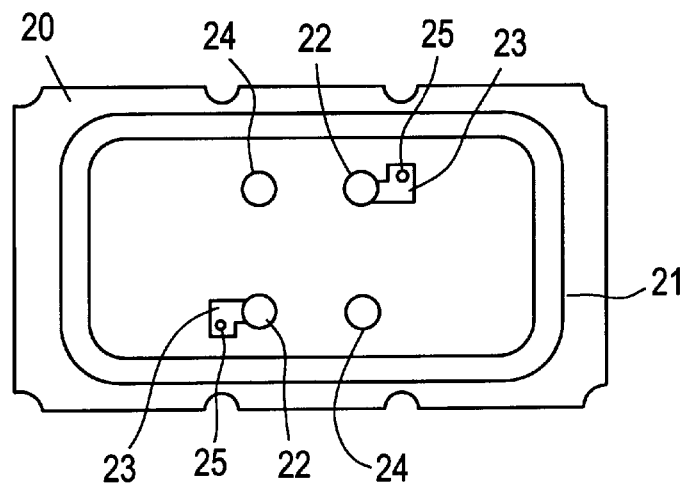
FIG. 2 is a plan view of a base substrate in accordance with a preferred embodiment of the present invention.
Figure 3:
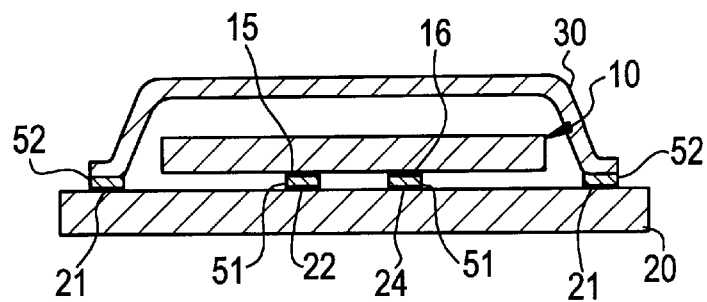
FIG. 3 is a sectional of a 1-port type surface acoustic wave device in accordance with a preferred embodiment of the present invention.

FIGS. 1 through 3 show the construction of a 1-port type surface acoustic wave device in accordance with a preferred embodiment of the present invention. FIG. 1 is a plan view of a 1-port surface acoustic wave resonator; FIG. 2 is a plan view of a base substrate; and FIG. 3 is a sectional of a 1-port type surface acoustic wave device. In the drawings, the components which are the same as or equivalent to those of the conventional example are indicated by the same reference numerals, and a detailed description of such components will be omitted.

As shown in FIG. 1, in the 1-port surface acoustic wave resonator of this preferred embodiment, indicated by numeral 10, two round dummy bump electrodes 16 are provided in addition to the two input/output bump electrodes 15 located at the forward ends of the input/output extraction electrodes 14. Further, in the base substrate of this preferred embodiment, indicated by numeral 20, two round dummy electrode lands 24 are provided in addition to the two input/output electrode lands 22.

The two input/output bump electrodes 15 and the two dummy bump electrodes 16 are preferably arranged diagonally on either side of the IDT electrode 12 on the surface acoustic wave substrate 11. The input/output electrode lands 22 and the dummy electrode lands 24, which correspond in position to the input/output bump electrodes 15 and the dummy bump electrodes 16, are also arranged diagonally on the base substrate 20.

As shown in FIG. 3, in the 1-port type surface acoustic wave device of this preferred embodiment, the 1-port surface acoustic wave resonator 10 and the base substrate 20 are arranged such that the surface on which the bump electrodes 15 and 16 are disposed and the surface on which the electrode lands 22 and 24 are disposed are opposed to each other. The bump electrodes 15 and 16 and the electrode lands 22 and 24 are joined together preferably by means of solder bumps 51, whereby the 1-port surface acoustic wave resonator 10 is connected and secured to the base substrate 20.

In the construction of this preferred embodiment, the two input/output bump electrodes 15 are arranged so as to be located at the same positions as the input/output bump electrodes of a 2-port surface acoustic wave resonator of a similar construction, and the dummy bump electrodes 16 are arranged so as to be located at the same positions as the grounding bump electrodes of this 2-port surface acoustic wave resonator. Similarly, the electrode lands 22 and 24 of the base substrate 20 of this preferred embodiment are arranged so as to be located at the same positions as the bump electrodes of a base substrate on which the above 2-port surface acoustic wave resonator is to be placed.

In this way, in the 1-port surface acoustic wave resonator 10 and the base substrate 20 constituting the 1-port type surface acoustic wave device of this preferred embodiment, the bump electrodes 15 and 16 and the electrode lands 22 and 24 are disposed at the same positions as those of a 2-port type surface acoustic wave device of a similar construction, so that the 1-port type surface acoustic wave device of this preferred embodiment can be produced by using the same tools as those used for the production of a 2-port type surface acoustic wave device of a similar construction. In other words, it is possible to use the same tools for the production of different kinds of surface acoustic wave devices, whereby the administration of the tools is facilitated and the operation of changing tools is simplified, thereby contributing to a reduction in production time and difficulty.

Further, in this preferred embodiment, the 1-port surface acoustic wave resonator is connected and secured to the base substrate by four solder bumps, whereby a substantial improvement is achieved in terms of impact resistance as compared with the conventional device.

Figure 4A:
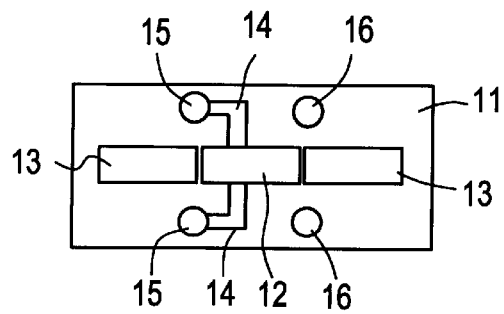
FIGS. 4(a) through 4(d) are plan views of 1-port surface acoustic wave resonators in accordance with other preferred embodiments of the present invention.
Figure 4B:
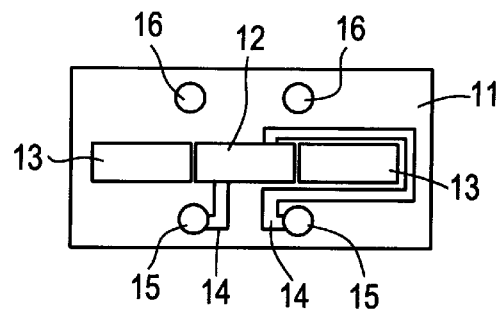
Figure 4C:
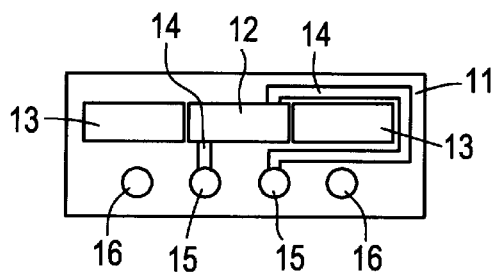
Figure 4D:
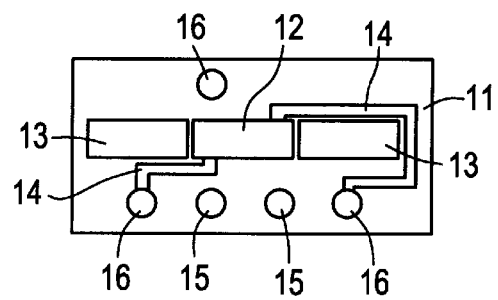
Figure 5:
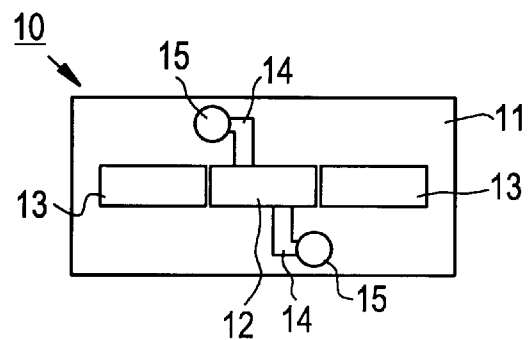
FIG. 5 is a plan view of a conventional 1-port surface acoustic wave resonator.
Figure 6:
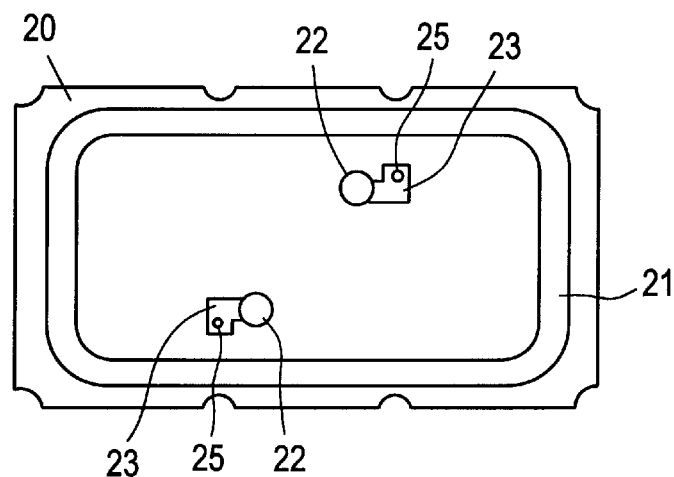
FIG. 6 is a plan view of a conventional base substrate.
Figure 7:
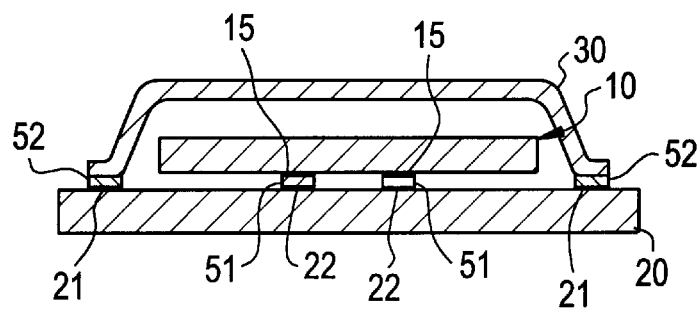
FIG. 7 is a sectional of a conventional 1-port type surface acoustic wave device.

The arrangement (forming positions) of the bump electrodes of the 1-port surface acoustic wave resonator and the electrode lands of the base substrate is not restricted to that of the above-described preferred embodiment. It is also possible to adopt, for example, arrangements as shown in FIGS. 4(a) through 4(d). Further, the number of dummy bump electrodes is not restricted to two. It is also possible to provide three dummy bump electrodes, as shown in FIG. 4(d). The number of dummy bump electrodes may be four or more. In this case also, the position at which each of the bump electrodes is formed corresponds to one of the positions where the bump electrodes of a 2-port surface acoustic wave resonator are formed.

Further, it is also possible to form three or more dummy electrode lands on the base substrate. The number of dummy electrode lands on the base substrate may be larger than the number of dummy electrodes on the associated surface acoustic wave resonator. In this case, no solder for solder bump bonding is applied to the surplus dummy electrode lands. By thus forming a large number of electrode lands on the base substrate, it is possible to use the same base substrate for many types of surface acoustic wave resonator.

While the above preferred embodiment has been described with reference to a 1-port surface acoustic wave resonator of the type in which reflector electrodes are formed on either side of the IDT electrode, the present invention is also applicable to an end-surface-reflection type 1-port surface acoustic wave resonator, which has no reflector electrodes.

As described above, the 1-port type surface acoustic wave device of the preferred embodiments of the present invention can be produced by using the same tools as used for the production of a 2-port type surface acoustic wave device of a similar construction, which means it is possible to use the same tools for the production of different kinds of surface acoustic wave devices. As a result, the administration of the tools is facilitated, and a reduction in production time can be achieved, thereby making it possible to achieve a substantial reduction in cost.

Further, the 1-port surface acoustic wave resonator is connected and secured to the base substrate by at least four solder bumps, whereby a substantial improvement is achieved in terms of impact resistance as compared with the conventional device.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A 1-port surface acoustic wave device comprising:

a 1-port surface acoustic wave resonator including a surface acoustic wave substrate, at least two input/output bump electrodes electrically connected to an interdigitated electrode on the surface acoustic wave substrate and at least two dummy bump electrodes each made of an electrically conductive electrode material and disposed on said surface acoustic wave substrate so as to be free from connection to other elements, and a 2-port surface acoustic wave resonator base substrate on which input/output electrode lands and dummy electrode lands each made of an electrically conductive electrode material are disposed so as to be configured to receive at least four input/output bump electrodes of a 2-port surface acoustic wave resonator, the input/output electrode lands being connected to extraction electrodes and via holes and the dummy electrode lands not being connected to extraction electrodes and via holes; wherein said at least two input/output bump electrodes and said at least two dummy bump electrodes are solder-bump bonded to respective ones of said input/output electrode lands and said dummy electrode lands so that said 1-port surface acoustic wave resonator is joined to said two port resonator base substrate in a face-down arrangement.

2. A 1-port surface acoustic wave device according to claim 1, wherein said at least two dummy bump electrodes are located diagonally opposite to each other.

3. A 1-port surface acoustic wave device according to claim 1, wherein said at least two input/output bump electrodes are arranged diagonally opposite to each other.

4. A 1-port surface acoustic wave device according to claim 1, wherein at least two of said input/output electrodes lands are arranged diagonally opposite to each other on said base substrate.

5. A 1-port surface acoustic wave device according to claim 1, wherein at least two of said dummy electrode lands are arranged diagonally opposite to each other on said base substrate.

6. A 1-port surface acoustic wave device according to claim 1, wherein each of said at least two input/output bump electrodes are arranged diagonally opposite to a respective one of said at least two dummy bump electrodes such that surface acoustic wave substrate is joined to said base substrate in any positional orientation relative to said base substrate and such that said input/output electrode lands and said dummy electrode lands are aligned with respective ones of said at least two input/output bump electrodes and said at least two dummy bump electrodes.

* * * * *